(12) United States Patent
Chung

(10) Patent No.: US 7,907,011 B2
(45) Date of Patent: Mar. 15, 2011

(54) FOLDED CASCODE OPERATIONAL AMPLIFIER HAVING IMPROVED PHASE MARGIN

(75) Inventor: Kyu Young Chung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/461,531

(22) Filed: Aug. 14, 2009

(65) Prior Publication Data

US 2010/0039179 A1  Feb. 18, 2010

(30) Foreign Application Priority Data

Aug. 18, 2008 (KR) .................. 10-2008-0080617

(51) Int. Cl.
*H03F 3/45* (2006.01)

(52) U.S. Cl. .......... 330/255; 330/257; 330/302; 330/261

(58) Field of Classification Search .................. 330/255, 330/257, 302, 261
See application file for complete search history.

(56) References Cited

U.S. PATENT DOCUMENTS

| | | | |
|---|---|---|---|
| 6,018,268 A | 1/2000 | Tan | |
| 6,476,675 B1 | 11/2002 | Sun | |
| 7,187,235 B2 * | 3/2007 | Moon | 330/255 |
| 7,342,450 B2 * | 3/2008 | Jones | 330/253 |
| 7,362,173 B1 * | 4/2008 | Knausz | 330/253 |
| 7,586,373 B2 * | 9/2009 | Kim | 330/257 |
| 7,639,078 B2 * | 12/2009 | Rayanakorn et al. | 330/255 |
| 7,652,538 B2 * | 1/2010 | Choi | 330/292 |
| 2007/0120604 A1 | 5/2007 | Li | |

* cited by examiner

*Primary Examiner* — Patricia Nguyen
(74) *Attorney, Agent, or Firm* — Harness, Dickey & Pierce, P.L.C.

(57) ABSTRACT

A folded cascode operational amplifier having an improved phase margin due to pole-zero cancellation by using a plurality of cascode-connected bias circuits and frequency compensation capacitors.

19 Claims, 8 Drawing Sheets

*NOTE:CL>>Cc

US 7,907,011 B2

FOLDED CASCODE OPERATIONAL AMPLIFIER HAVING IMPROVED PHASE MARGIN

PRIORITY STATEMENT

This application claims priority under 35 U.S.C. §119 to Korean Patent Application No. 10-2008-0080617, filed on Aug. 18, 2008, in the Korean Intellectual Property Office (KIPO), the entire contents of which is incorporated herein by reference.

BACKGROUND

1. Field

Example embodiments relate to an operational amplifier, and more particularly, to a folded cascode operational amplifier having an improved phase margin through frequency compensation.

2. Description of the Related Art

Analog amplifiers include class A amplifiers, class B amplifiers, and class AB amplifiers. The class A amplifiers have high linearity but have low efficiency. As for the class B amplifier, energy loss is minimized but signal distortion occurs easily.

A folded cascode operational amplifier classified as a class AB amplifier which is a compromise between a class A amplifier and a class B amplifier has high efficiency because it is driven at a low voltage and has high linearity because an output voltage swings from a ground voltage to a power supply voltage, so that the folded cascode operational amplifier can be widely used in various kinds of electronic devices such as video devices and audio devices. However, the folded cascode operational amplifier is disadvantageous in that it is difficult to ensure a phase margin in an operating range.

SUMMARY

Example embodiments provide a folded cascode operational amplifier having an improved phase margin in an operating range.

According to example embodiments, provided is a folded cascode operational amplifier including a first folded cascode operational amplifier of a first conductivity type, a second folded cascode operational amplifier of a second conductivity type, an output buffer, a first capacitor, and a second capacitor. The first folded cascode operational amplifier is driven in response to a first input signal and a second input signal and includes a first current mirror, a first bias circuit, and a second bias circuit connected in series between a first power supply voltage line, a first node, and a second node.

The second folded cascode operational amplifier is driven in response to the first input signal and the second input signal and includes a second current mirror, a third bias circuit, and a fourth bias circuit connected in series between a second power supply voltage line, a third node, and a fourth node.

The output buffer buffers a voltage amplified based on a voltage of the second node and a voltage of the fourth node to an output terminal. The first capacitor is connected between the output terminal and a fifth node between the first current mirror and the first bias circuit. The second capacitor is connected between the output terminal and a sixth node between the second current mirror and the third bias circuit.

According to example embodiments, provided is a folded cascode operational amplifier including a first differential transistor pair of a first conductivity type and a second differential transistor pair of a second conductivity type configured to be driven in response to a first input signal and a second input signal; a first current mirror and a first bias circuit connected in series between a first power supply voltage line and a pair of output terminals of the first differential transistor pair; a second bias circuit connected between the pair of output terminals of the first differential transistor pair, a first node, and a second node; a second current mirror and a third bias circuit connected in series between a second power supply voltage line and a pair of output terminals of the second differential transistor pair; a fourth bias circuit connected between the pair of output terminals of the second differential transistor pair, a third node, and a fourth node; an output buffer configured to buffer a voltage amplified based on a voltage of the second node and a voltage of the fourth node; a first capacitor connected between the output terminal and a fifth node between the first current mirror and the first bias circuit; and a second capacitor connected between the output terminal and a sixth node between the second current mirror and the third bias circuit.

BRIEF DESCRIPTION OF THE DRAWINGS

Example embodiments will be more clearly understood from the following brief description taken in conjunction with the accompanying drawings. FIGS. 1-10 represent non-limiting, example embodiments as described herein.

FIG. 1 is a circuit diagram of a folded cascode operational amplifier including a capacitor to use Miller compensation.

FIG. 2 is a circuit diagram of a small signal model of the folded cascode operational amplifier illustrated in FIG. 1.

FIG. 3 is a circuit diagram of a folded cascode operational amplifier including a capacitor to use cascode Miller compensation.

FIG. 4 is a circuit diagram of a small signal model of the folded cascode operational amplifier illustrated in FIG. 3.

FIG. 5 is a circuit diagram of a folded cascode operational amplifier according to some embodiments of the present invention.

FIG. 6 is a circuit diagram of a small signal model of the folded cascode operational amplifier illustrated in FIG. 5.

FIG. 7 is a graph showing the frequency characteristic of the gain of an output voltage of each of the folded cascode operational amplifiers illustrated in FIGS. 1, 3, and 5, respectively.

FIG. 8 is a graph showing the frequency characteristic of the phase of an output voltage of each of the folded cascode operational amplifiers illustrated in FIGS. 1, 3, and 5, respectively.

Figure 1:
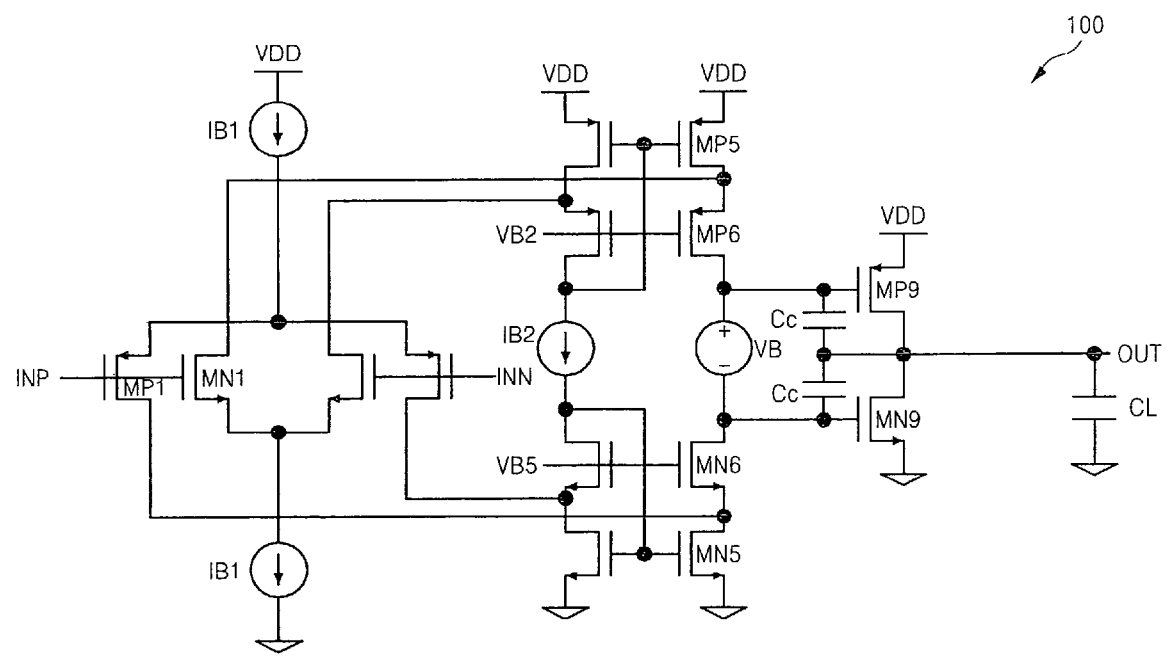

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments now will be described more fully hereinafter with reference to the accompanying drawings, in which example embodiments are shown. Example embodiments may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a circuit diagram of a folded cascode operational amplifier 100 including a capacitor Cc to use Miller compensation. Referring to FIG. 1, the folded cascode operational amplifier 100 may include a first differential transistor pair MN1 (including matched transistors which will be referred to a transistor pair denoted by one reference numeral hereinafter), a second differential transistor pair MP1, a first current mirror MP5, a first bias circuit MP6, a second current mirror MN5, a second bias circuit MN6, a bias constant current source IB2, a bias constant voltage source VB, a compensation capacitor pair Cc, and an output buffer including transistors MP9 and MN9.

The first differential transistor pair MN1 of a first conductivity type and the second differential transistor pair MP1 of a second conductivity type are driven in response to a first input signal INP and a second input signal INN, respectively, and each may have a corresponding tail current source IB1. VDD denotes a power supply voltage. VB2 denotes a bias voltage of the first bias circuit MP6. VB5 denotes a bias voltage of the second bias circuit MN6. OUT denotes an output terminal of the folded cascode operational amplifier 100. CL denotes a load capacitance.

Figure 2:
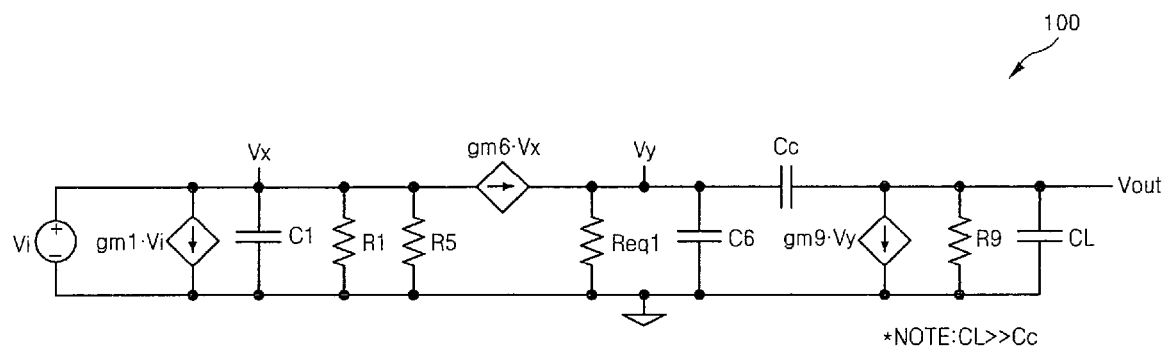

FIG. 2 is a circuit diagram of a small signal model of the folded cascode operational amplifier 100 illustrated in FIG. 1. Referring to FIGS. 1 and 2, "Vi" denotes a small signal differential input voltage, "gm1" denotes a transconductance of the differential transistor pair MN1 or MP1, "gm6" denotes a transconductance of the bias circuit MP6 or MN6, "gm9" is a transconductance of the transistor MP9 or MN9 of the output buffer, "R1" denotes a drain-source resistance Rds1 of the differential transistor pair MN1 or MP1, "R5" is a drain-source resistance Rds5 of the current mirror MP5 or MN5, and "R9" denotes a drain-source resistance Rds9 of the transistor MP9 or MN9 of the output buffer. Here, equivalent resistance Req1 may be expressed by Req1=gm6*Rds6*Rds1/Rds5. Herein, "Rds6" is a drain-source resistance of transistor MP6 or MN6.

"C1" denotes the sum of a drain-source capacitance Cds1 of the differential transistor pair MN1 or MP1, a drain-source capacitance Cds5 of the current mirror MP5 or MN5, and a drain-source capacitance Cds6 of the bias circuit MP6 or MN6 and may be approximated to the sum of the drain-source capacitance Cds6 of the bias circuit MP6 and the drain-source capacitance Cds6 of the bias circuit MN6. "C6" may be expressed by C6=Cds6+Cds9+gm9*Rds9*Cds9 and may be approximated to gm9*Rds9*Cds9. Here, Cds9 denotes a drain-source capacitance of the transistor MP9 or MN9 of the output buffer. Hereinafter, redundant description of elements having the same reference numerals and the same reference characters will be omitted.

The direct current (DC) gain of the folded cascode operational amplifier 100 is expressed by Equation (1);

$$\text{DC gain} = gm1 \cdot Req1 \cdot gm9 \cdot R9. \quad (1)$$

A first pole "pole1" of the folded cascode operational amplifier 100 is expressed by Equation (2);

$$\text{pole1} = -\frac{1}{gm9 \cdot Req1 \cdot R9 \cdot Cc}. \quad (2)$$

A second pole "pole2" of the folded cascode operational amplifier 100 is expressed by Equation (3);

$$\text{pole2} = -\frac{gm9}{CL}. \quad (3)$$

A first zero point "zero1" of the folded cascode operational amplifier 100 is expressed by equation (4);

$$\text{zero1} = -\frac{gm9}{Cc}. \quad (4)$$

Equations (1) through (4) are approximate values obtained from the small signal model and the load capacitance CL is assumed to be greater than the compensation capacitance Cc. In comparison between Equations (3) and (4), the numerators are the same, i.e., −gm9. However, the denominator CL in Equation (3) is greater than the denominator Cc in Equation (4). Accordingly, the first zero point "zero1" locates in a higher frequency range than the second pole "pole2", which means that a possibility of occurrence of pole-zero cancellation due to the first zero point "zero1" is low. In other words, the possibility that the first zero point "zero1" affects the reliability (i.e., ensuring of a phase margin) of the folded cascode operational amplifier 100 is low.

Figure 3:
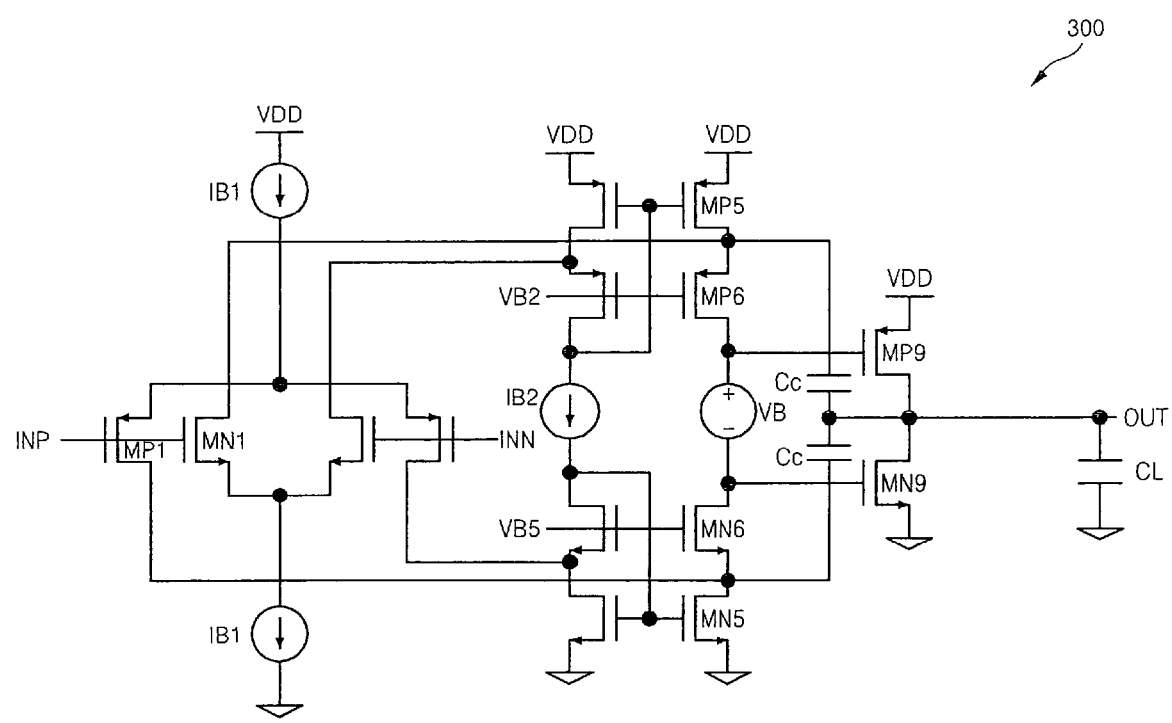

FIG. 3 is a circuit diagram of a folded cascode operational amplifier 300 including a capacitor Cc to use cascode Miller compensation. Only difference between the folded cascode operational amplifier 300 illustrated in FIG. 3 and the folded cascode operational amplifier 100 illustrated in FIG. 1 is the connection position of the compensation capacitors Cc. Thus, only the difference between the two folded cascode operational amplifiers 100 and 300 will be described below.

The compensation capacitors Cc illustrated in FIG. 1 are connected among the output terminal OUT and both ends of the bias constant voltage source VB. The compensation capacitors Cc illustrated in FIG. 3 are connected between the output terminal OUT and one of output terminals of the first differential transistor pair MN1 and between the output terminal OUT and one of output terminals of the second differential transistor pair MP1.

Figure 4:
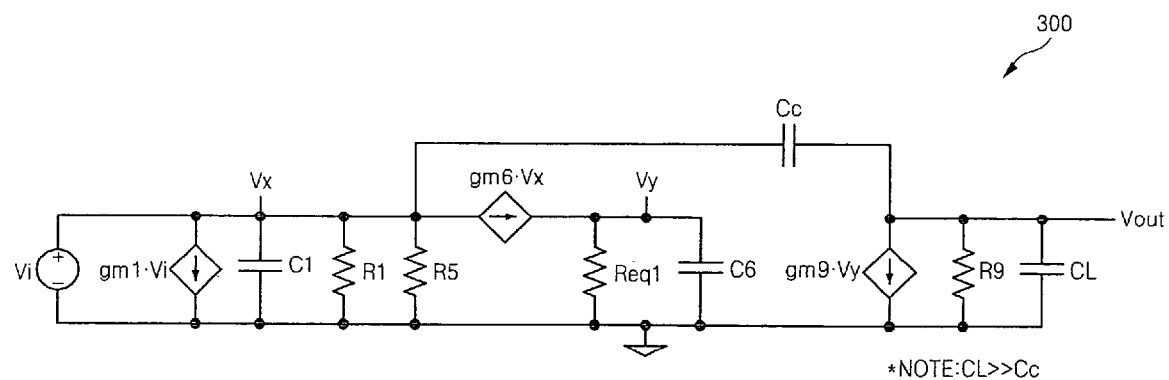

FIG. 4 is a circuit diagram of a small signal model of the folded cascode operational amplifier 300 illustrated in FIG. 3. Referring to FIGS. 2 and 4, the two folded cascode operational amplifiers 100 and 300 have the same DC gain and the first pole "pole1", but they are different in the second pole "pole2" and the first zero point "zero1".

The second pole "pole2" of the folded cascode operational amplifier 300 is expressed by Equation (5):

$$\text{pole2} = -\frac{Cc}{C6} \cdot \frac{gm9}{CL}. \quad (5)$$

The first zero point "zero1" of the folded cascode operational amplifier 300 is expressed by Equation (6):

$$\text{zero1} = \pm\sqrt{\frac{gm9 \cdot gm6}{Cc \cdot C6}}. \quad (6)$$

Referring to Equations (5) and (6), the first zero point "zero1" of the folded cascode operational amplifier 300 also locates in a higher frequency range than the second pole "pole2" thereof. Accordingly, a possibility that the first zero point "zero1" affects the folded cascode operational amplifier 300 is low.

Figure 5:
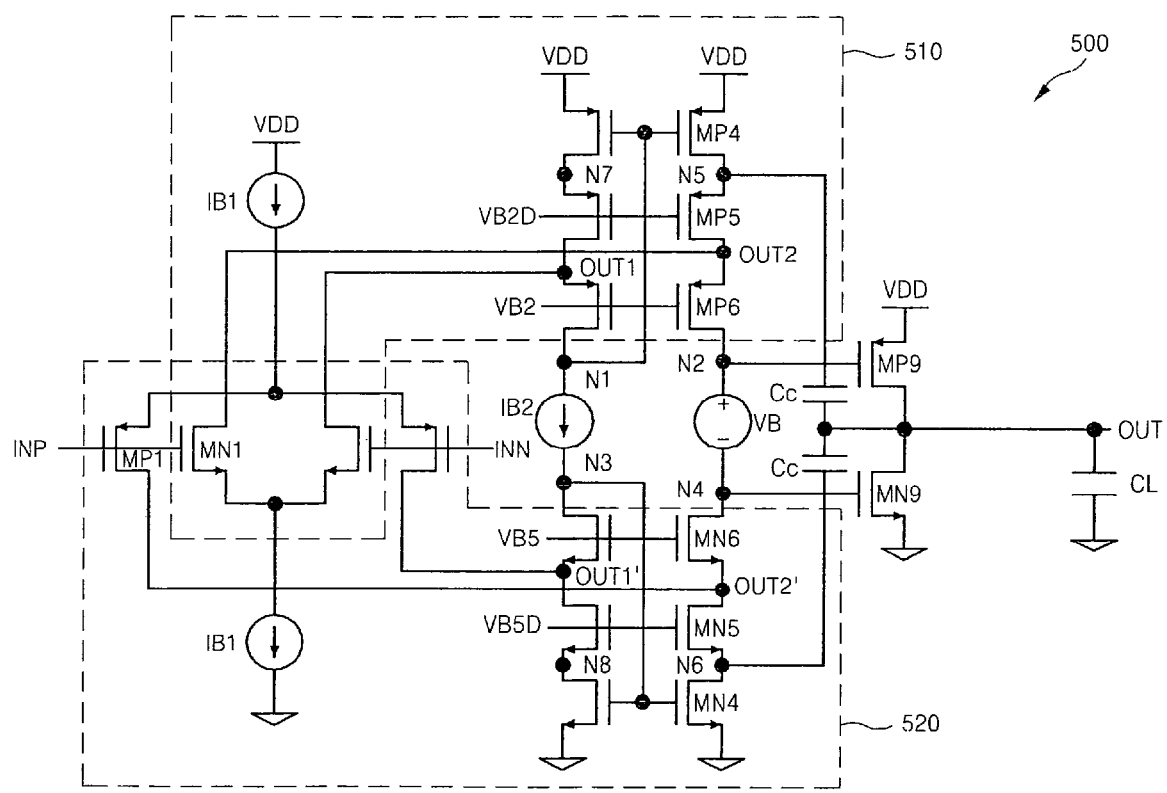

FIG. 5 is a circuit diagram of a folded cascode operational amplifier 500 according to example embodiments. Referring to FIG. 5, the folded cascode operational amplifier 500 may include a first differential transistor pair MN1, a second differential transistor pair MP1, a bias current source IB1 corresponding each of the first and second differential transistor pairs MN1 and MP1, a pair of current mirrors MP4 and MN4, a plurality of bias circuits MP5, MP6, MN5 and MN6, a bias constant current source IB2, a bias constant voltage source VB, an output buffer including transistors MP9 and MN9, and a pair of compensation capacitors Cc. The folded cascode operational amplifier 500 may be divided into a first folded cascode operational amplifier 510 of a first conductivity type, a second folded cascode operational amplifier 520 of a second conductivity type, the bias constant current source IB2, the bias constant voltage source VB, the output buffer (MP9 and MN9), and the pair of the compensation capacitors Cc.

The first folded cascode operational amplifier 510 may include the first differential transistor pair MN1, the bias current source IB1, the first current mirror MP4, and the first and second bias circuits MP5 and MP6. The second folded cascode operational amplifier 520 may include the second differential transistor pair MP1, the bias current source IB1, the second current mirror MN4, and the third and fourth bias circuits MN5 and MN6.

The first differential transistor pair MN1 may be a pair of first conductivity type transistors driven in response to a first input signal INP and a second input signal INN, respectively. The second differential transistor pair MP1 may be a pair of second conductivity type transistors driven in response to the first input signal INP and the second input signal INN, respectively. A first conductivity type transistor may be an N-type metal oxide semiconductor field effect transistor (MOSFET) and a second conductivity type transistor may be a P-type MOSFET.

The first current mirror MP4 and the first bias circuit MP5 are connected in series between a first power supply line VDD and a pair of output terminals OUT1 and OUT2 of the first differential transistor pair MN1. The pair of the output terminals OUT1 and OUT2 of the first differential transistor pair MN1 corresponds to a pair of output terminals OUT1 and OUT2 of the first folded cascode operational amplifier 510.

The first current mirror MP4 is connected among the first power supply line VDD, a fifth node N5, and a seventh node N7 and may include a pair of second conductivity type transistors respectively including gates connected in common with a first node N1. The first current mirror MP4 is an active load of the first differential transistor pair MN1. The first bias circuit MP5 is connected among the fifth node N5, the seventh node N7, and the output terminals OUT1 and OUT2 of the first differential transistor pair MN1 and may be implemented by a pair of second conductivity type transistors gated in response to a first bias voltage VB2D.

The second bias circuit MP6 may be connected among the output terminals OUT1 and OUT2 of the first differential transistor pair MN1, the first node N1, and a second node 2. The second bias circuit MP6 may be implemented by a pair of second conductivity type transistors gated in response to a second bias voltage VB2.

The second current mirror MN4 and the third bias circuit MN5 are connected in series between a second power supply line and a pair of output terminals OUT1' and OUT2' of the second differential transistor pair MP1. The pair of the output terminals OUT1' and OUT2' of the second differential transistor pair MP1 corresponds to a pair of output terminals OUT1' and OUT2' of the second folded cascode operational amplifier 520. The second power supply voltage line may be a ground voltage line.

The second current mirror MN4 is connected among the second power supply line, a sixth node N6, and an eighth node N8 and may include a pair of first conductivity type transistors respectively including gates connected in common with a third node N3. The second current mirror MN4 is an active load of the second differential transistor pair MP1. The third bias circuit MN5 is connected among the sixth node N6, the eighth node N8, and the output terminals OUT1' and OUT2' of the second differential transistor pair MP1 and may be implemented by a pair of first conductivity type transistors gated in response to a third bias voltage VB5D.

The fourth bias circuit MN6 may be connected among the output terminals OUT1' and OUT2' of the second differential transistor pair MP1, the third node N3, and a fourth node 4. The fourth bias circuit MN6 may be implemented by a pair of first conductivity type transistors gated in response to a fourth bias voltage VB5.

The bias constant current source IB2 may be connected between the first node N1 and the third node N3. The bias constant voltage source VB may be connected between the second node N2 and the fourth node N4.

The output buffer may buffer a voltage amplified based on a voltage of the second node N2 and a voltage of the fourth node N4 to an output terminal OUT of the folded cascode operational amplifier 500. The output buffer may include the pull-up transistor MP9 and the pull-down transistor MN9. The pull-up transistor MP9 may be connected between the first power supply line VDD and the output terminal OUT and implemented by a second conductivity type transistor gated in response to the voltage of the second node N2. The pull-down transistor MN9 may be connected between the second power supply line and the output terminal OUT and implemented by a first conductivity type transistor gated in response to the voltage of the fourth node N4.

One of the compensation capacitors Cc may be connected between the output terminal OUT and the fifth node N5 between the first current mirror MP4 and the first bias circuit MP5. The other of the compensation capacitors Cc may be connected between the output terminal OUT and the sixth node N6 between the second current mirror MN4 and the third bias circuit MN5.

Figure 6:
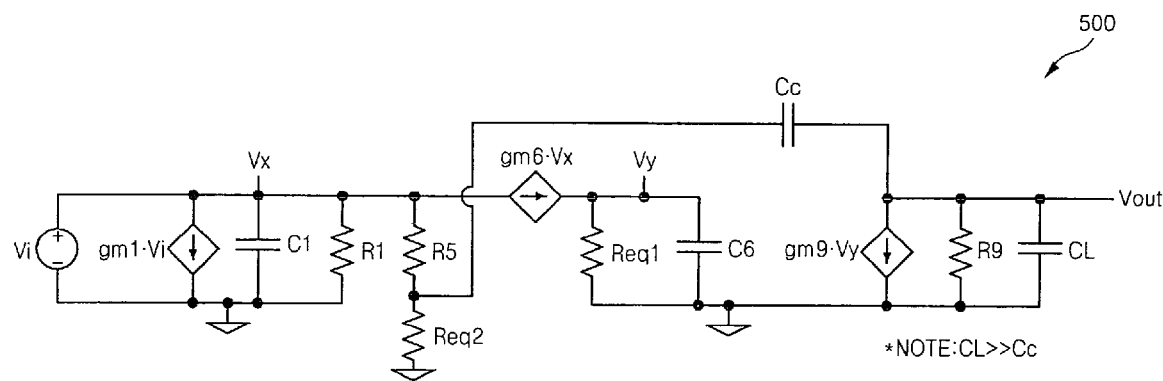

FIG. 6 is a circuit diagram of a small signal model of the folded cascode operational amplifier 500 illustrated in FIG. 5. Referring to FIGS. 5 and 6, Rds4 denotes a drain-source resistance of the current mirror MP4 or MN4 and Req2=gm5*Rds4*Rds5. Referring to FIGS. 4 and 6, the two folded cascode operational amplifier 300 and 500 have the same DC gain, first pole "pole1" and second pole "pole2", but they are different in the first zero point "zero1". The first zero point "zero1" of the folded cascode operational amplifier 500 is expressed by Equation (7):

$$\text{zero1} = -\frac{1}{2 Req1 \cdot C6}. \tag{7}$$

Referring to Equations (5) through (7), it can be inferred that the first zero point "zero1" of the folded cascode operational amplifier 500 locates in a lower frequency range than that of the folded cascode operational amplifier 300. This means that the pole-zero cancellation may occur due to the first zero point "zero1" of the folded cascode operational amplifier 500. Accordingly, the folded cascode operational amplifier 500 has an improved phase margin compared to the folded cascode operational amplifier 300, thereby having more reliable phase characteristics using the same compensation capacitors Cc.

Figure 7:
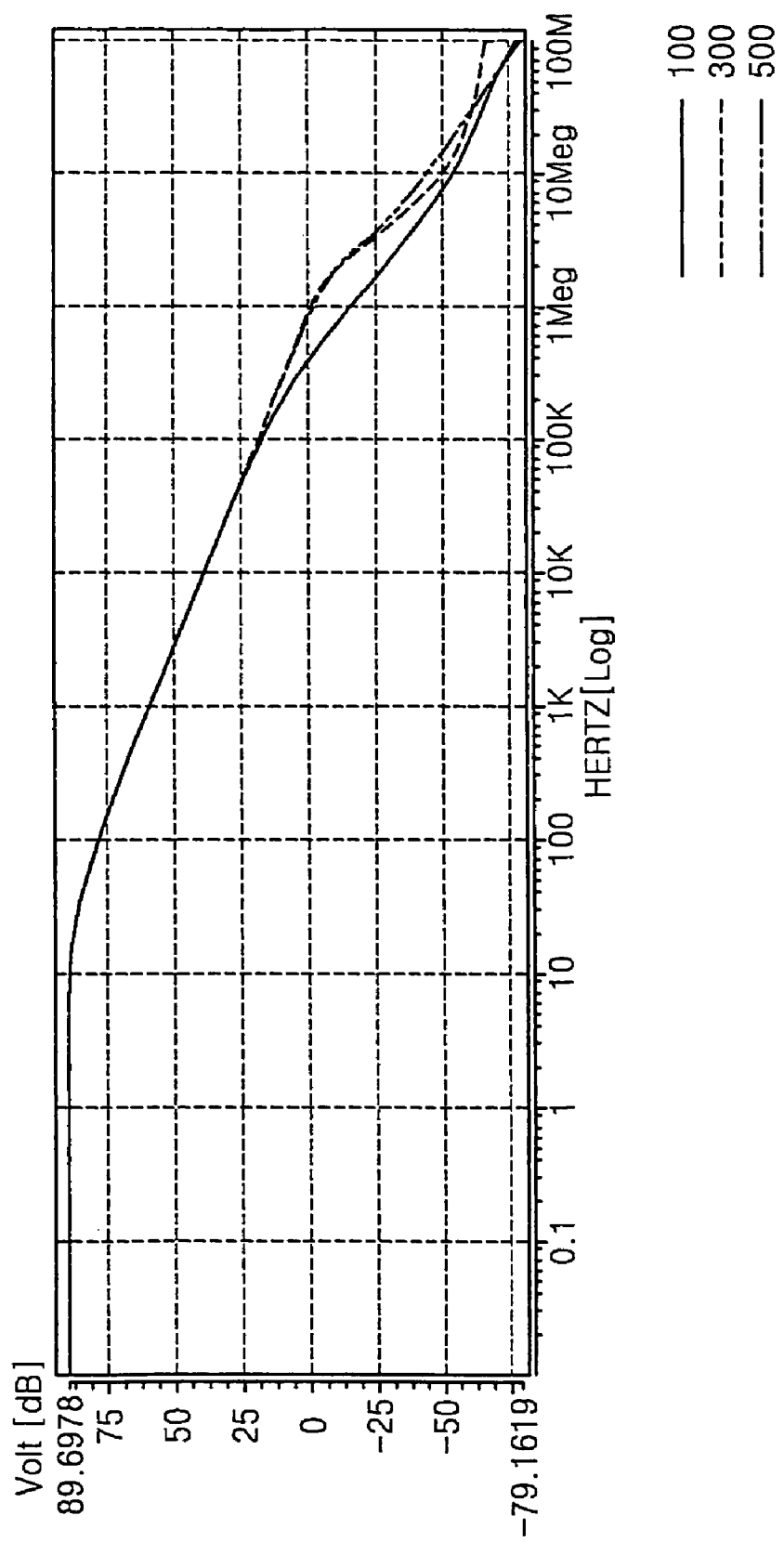
Figure 8:
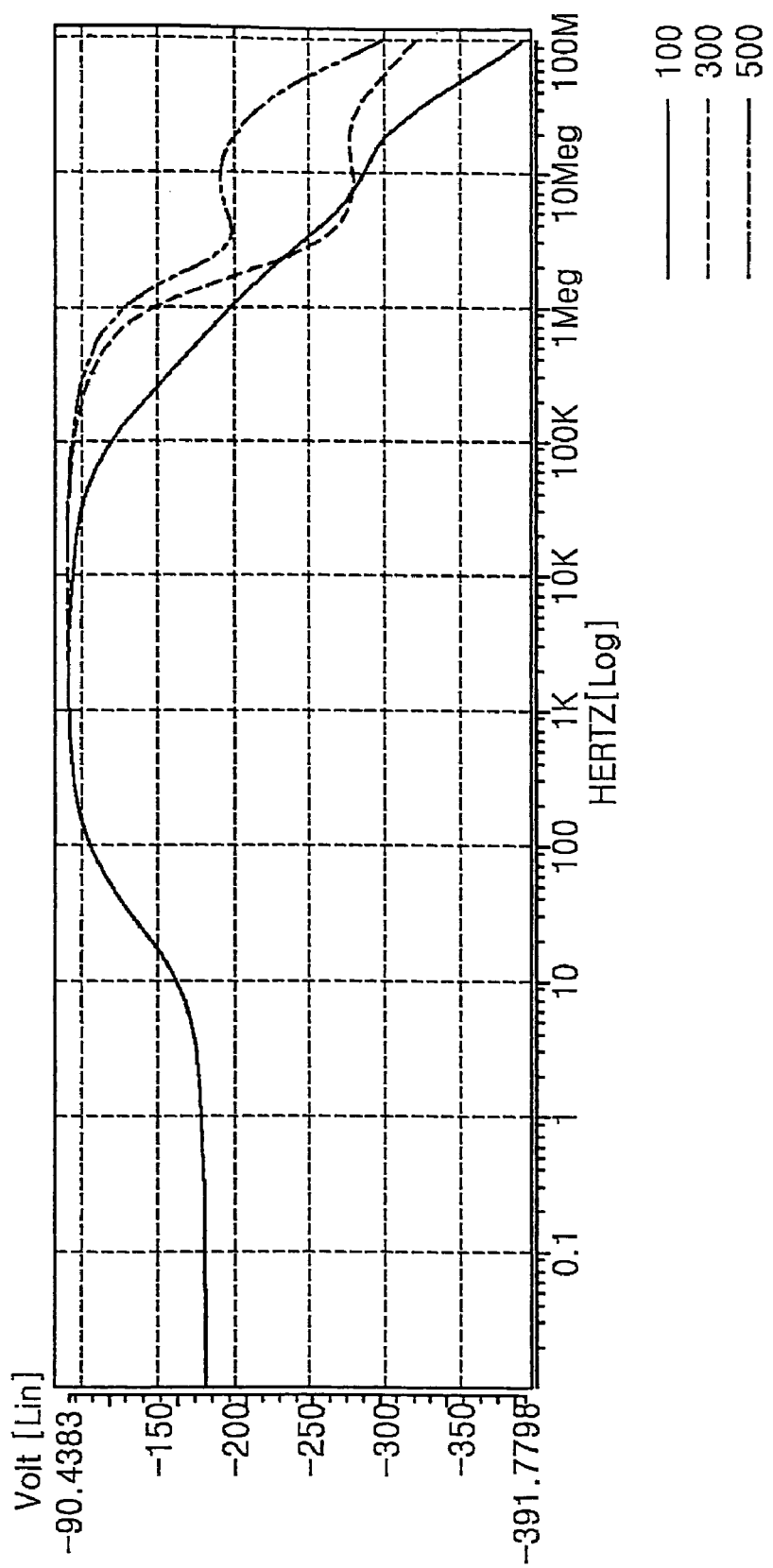

FIG. 7 is a graph showing the frequency characteristic of the gain of an output voltage of each of the folded cascode operational amplifiers 100, 300, and 500 illustrated in FIGS. 1, 3, and 5, respectively. FIG. 8 is a graph showing the frequency characteristic of the phase of an output voltage of each of the folded cascode operational amplifiers 100, 300, and 500 illustrated in FIGS. 1, 3, and 5, respectively. In FIGS. 7 and 8, the solid curves indicate the results of simulating the folded cascode operational amplifier 100 illustrated in FIG. 1. The dashed lines indicate the results of simulating the folded cascode operational amplifier 300 illustrated in FIG. 3. The alternate long and two short dashes lines indicate the result of simulating the folded cascode operational amplifier 500 illustrated in FIG. 5.

Referring to FIGS. 7 and 8, the frequency characteristics of the gain and the phase of the output voltage are excellent in order of the folded cascode operational amplifier 500 illustrated in FIG. 5, the folded cascode operational amplifier 300 illustrated in FIG. 3, and the folded cascode operational amplifier 100 illustrated in FIG. 1.

Referring to FIG. 8, when the gain of the output voltage is 0 dB, the folded cascode operational amplifier 100 of FIG. 1 has a phase margin of 15.8 degrees, the folded cascode operational amplifier 300 of FIG. 3 has a phase margin of 38 degrees, and the folded cascode operational amplifier 500 of FIG. 5 has a phase margin of 57.1 degrees. Accordingly, it can be inferred that the output voltage of the folded cascode operational amplifier 500 has a greatly improved phase margin.

According to the present invention, a folded cascode operational amplifier can have an improved phase margin due to pole-zero cancellation by using a plurality of cascode-connected bias circuits and two capacitors for frequency compensation.

While example embodiments have been particularly shown and described, it will be understood by those of ordinary skill in the art that various changes in forms and details may be made therein without departing from the spirit and scope of the following claims.

What is claimed is:
1. A folded cascode operational amplifier comprising:
   a first folded cascode operational amplifier, of a first conductivity type, configured to be driven in response to a first input signal and a second input signal, the first folded cascode operational amplifier including a first current mirror, a first bias circuit, and a second bias circuit connected in series between a first power supply voltage line, a first node, and a second node;
   a second folded cascode operational amplifier, of a second conductivity type, configured to be driven in response to the first input signal and the second input signal, the second folded cascode operational amplifier including a second current mirror, a third bias circuit, and a fourth bias circuit connected in series between a second power supply voltage line, a third node, and a fourth node;
an output buffer configured to buffer a voltage amplified based on a voltage of the second node and a voltage of the fourth node;
a first capacitor connected between an output terminal and a fifth node between the first current mirror and the first bias circuit;
a second capacitor connected between the output terminal and a sixth node between the second current mirror and the third bias circuit;
a bias constant current source connected between the first node and the third node; and
a bias constant voltage source connected between the second node and the fourth node.

2. The folded cascode operational amplifier of claim 1, wherein the second power supply voltage line is a ground line.

3. The folded cascode operational amplifier of claim 1, further comprising:
a load capacitor connected between the first and second capacitors and a ground line, wherein
a capacitance of the first capacitor is equal to a capacitance of the second capacitor, and
a capacitance of the load capacitor is much greater than the capacitance of the first capacitor and the capacitance of the second capacitor.

4. The folded cascode operational amplifier of claim 1, wherein the first current mirror includes a pair of second conductivity type transistors configured to be connected between the first power supply voltage line, the fifth node, and a seventh node and having gates connected in common with the first node.

5. The folded cascode operational amplifier of claim 4, wherein
the first bias circuit includes a pair of second conductivity type transistors connected between the fifth node, the seventh node, and a pair of output terminals of the first folded cascode operational amplifier, and
the first bias circuit is gated in response to a first bias voltage.

6. The folded cascode operational amplifier of claim 5, wherein
the second bias circuit includes a pair of second conductivity type transistors connected between the pair of output terminals of the first folded cascode operational amplifier, the first node, and the second node, and
the second bias circuit is gated in response to a second bias voltage.

7. The folded cascode operational amplifier of claim 1, wherein the second current mirror includes a pair of first conductivity type transistors connected between the second power supply voltage line, the sixth node, and an eighth node and having gates connected in common with the third node.

8. The folded cascode operational amplifier of claim 7, wherein
the third bias circuit includes a pair of first conductivity type transistors connected between the sixth node, the eighth node, and a pair of output terminals of the second folded cascode operational amplifier, and
the third bias circuit is gated in response, to a third bias voltage.

9. The folded cascode operational amplifier of claim 8, wherein
the fourth bias circuit includes a pair of first conductivity type transistors connected between the pair of output terminals of the second folded cascode operational amplifier, the third node, and the fourth node, and
the fourth bias circuit is gated in response to a fourth bias voltage.

10. The folded cascode operational amplifier of claim 1, the output buffer comprising:
a second conductivity type pull-up transistor connected between the first power supply line and the output terminal and gated in response to the voltage of the second node; and
a first conductivity type pull-down transistor connected between the second power supply line and the output terminal and gated in response to the voltage of the fourth node.

11. A folded cascode operational amplifier comprising:
a first differential transistor pair, of a first conductivity type, configured to be driven in response to a first input signal and a second input signal;
a second differential transistor pair, of a second conductivity type, configured to be driven in response to the first input signal and the second input signal;
a first current mirror and a first bias circuit connected in series between a first power supply voltage line and a pair of output terminals of the first differential transistor pair;
a second bias circuit connected between the pair of output terminals of the first differential transistor pair, a first node, and a second node;
a second current mirror and a third bias circuit connected in series between a second power supply voltage line and a pair of output terminals of the second differential transistor pair;
a fourth bias circuit connected between the pair of output terminals of the second differential transistor pair, a third node, and a fourth node;
an output buffer configured to buffer a voltage amplified based on a voltage of the second node and a voltage of the fourth node;
a first capacitor connected between an output terminal and a fifth node between the first current mirror and the first bias circuit; and
a second capacitor connected between the output terminal and a sixth node between the second current mirror and the third bias circuit.

12. The folded cascode operational amplifier of claim 11, further comprising:
a bias constant current source connected between the first node and the third node; and
a bias constant voltage source connected between the second node and the fourth node.

13. The folded cascode operational amplifier of claim 11, wherein the second power supply voltage line is a ground line.

14. The folded cascode operational amplifier of claim 11, further comprising:
a load capacitor connected between the first and second capacitors and a ground line, wherein
a capacitance of the first capacitor is equal to a capacitance of the second capacitor, and
a capacitance of the load capacitor is much greater than the capacitance of the first capacitor and the capacitance of the second capacitor.

15. The folded cascode operational amplifier of claim 11, wherein
the first current mirror includes a pair of second conductivity type transistors connected between the first power supply voltage line, the fifth node, and a seventh node and having gates connected in common with the first node, the first bias circuit includes a pair of second conductivity type transistors connected between the fifth node, the seventh node, and a pair of output terminals of the first differential transistor pair and gated in response to a first bias voltage, and the second bias circuit includes a pair of second conductivity type transistors connected between the pair of output terminals of the first differential transistor pair, the first node, and the second node and gated in response to a second bias voltage.

16. The folded cascode operational amplifier of claim 11, wherein the second current mirror includes a pair of first conductivity type transistors connected between the second power supply voltage line, the sixth node, and an eighth node and having gates connected in common with the third node, the third bias circuit including a pair of first conductivity type transistors connected between the sixth node, the eighth node, and a pair of output terminals of the second differential transistor pair and gated in response to a third bias voltage, the fourth bias circuit includes a pair of first conductivity type transistors connected among the pair of output terminals of the second differential transistor pair, the third node, and the fourth node and gated in response to a fourth bias voltage.

17. The folded cascode operational amplifier of claim 11, the output buffer comprising:

a second conductivity type pull-up transistor connected between the first power supply line and the output terminal and gated in response to the voltage of the second node; and a first conductivity type pull-down transistor connected between the second power supply line and the output terminal and gated in response to the voltage of the fourth node.

18. A folded cascode operational amplifier comprising:

a differential transistor pair each transistor having a first transconductance, a first drain-source capacitance and a first drain-source resistance, at least one current mirror including at least one transistor having a second transconductance, a second drain-source capacitance and a second drain-source resistance, at least one first bias circuit including at least one transistor having a third transconductance, a third drain-source capacitance and a third drain-source resistance, and an output buffer including at least one transistor having a fourth transconductance, a fourth drain-source capacitance and a fourth drain-source resistance;

a capacitor having a first capacitance; and a load capacitor having a second capacitance, wherein a first equivalent resistance is directly proportional to the third transconductance, the third drain-source resistance and the first drain-source resistance and indirectly proportional to the second drain-source resistance, a first equivalent capacitance is directly proportional to the fourth transconductance, the fourth drain-source resistance and the fourth drain-source capacitance a DC gain of the folded cascode operational amplifier is directly proportional to the first transconductance, the first equivalent resistance, the fourth transconductance and the fourth drain-source resistance, a first pole of the folded cascode operational amplifier is indirectly proportional to the fourth transconductance, the first equivalent resistance, the fourth drain-source resistance and the first capacitance, a second pole of the folded cascode operational amplifier is directly proportional to the fourth transconductance and indirectly proportional to the second capacitance, and a zero of the folded cascode operational amplifier is indirectly proportional to the first equivalent resistance and the first equivalent capacitance.

19. The folded cascode operational amplifier of claim 18, comprising:

at least one second bias circuit, wherein the second pole of the folded cascode operational amplifier is directly proportional to the first capacitance and the fourth transconductance and indirectly proportional to the first equivalent capacitance and the second capacitance.

* * * * *